United States Patent
Srivastava et al.

(10) Patent No.: US 9,537,061 B2
(45) Date of Patent: Jan. 3, 2017

(54) PHOSPHOR COMPOSITIONS AND LIGHTING APPARATUS THEREOF

(71) Applicant: General Electric Company, Schenectady, NY (US)

(72) Inventors: Alok Mani Srivastava, Niskayuna, NY (US); Holly Ann Comanzo, Niskayuna, NY (US); William Winder Beers, Chesterland, OH (US); Samuel Joseph Camardello, Latham, NY (US); Fangming Du, Cleveland, OH (US); William Erwin Cohen, Cleveland, OH (US)

(73) Assignee: General Electric Company, Niskayuna, NY (US)

(*) Notice: Subject to any disclaimer, the term of this patent is extended or adjusted under 35 U.S.C. 154(b) by 0 days.

(21) Appl. No.: 14/568,170

(22) Filed: Dec. 12, 2014

(65) Prior Publication Data

US 2016/0172549 A1 Jun. 16, 2016

(51) Int. Cl.
*H01L 33/00* (2010.01)
*H01L 33/50* (2010.01)
*C09K 11/77* (2006.01)

(52) U.S. Cl.
CPC ......... *H01L 33/504* (2013.01); *C09K 11/7733* (2013.01); *C09K 11/7734* (2013.01);
(Continued)

(58) Field of Classification Search
CPC ...... H01L 33/504; H01L 33/505; H01L 33/50; H01L 2251/5361; H01L 33/502; C09K 11/7735; C09K 11/7733
See application file for complete search history.

(56) References Cited

U.S. PATENT DOCUMENTS 5,034,607 A * 7/1991 McAllister ......... C09K 11/7706
 250/484.4
5,140,163 A * 8/1992 Tecotzky ........... C09K 11/7721
 250/484.4
(Continued)

FOREIGN PATENT DOCUMENTS

CN 102391859 A 3/2012
CN 102660262 A 9/2012
EP 0522619 A1 1/1993

OTHER PUBLICATIONS

Meijerink et al., "A new photostimulable phosphor: Eu<2+>-activated bariumbromosilicate (Ba5SiO4Br6)", Materials Chemistry and Physics, vol. No. 21, Issue No. 3, pp. 261-270, Mar. 1, 1989.
(Continued)

*Primary Examiner* — Yosef Gebreyesus
(74) *Attorney, Agent, or Firm* — Mary Louise Stanford

(57) ABSTRACT

A phosphor composition is disclosed. A phosphor composition, comprises at least 10 atomic % bromine; silicon, germanium or combination thereof; oxygen; a metal M, wherein M comprises zinc (Zn), magnesium (Mg), calcium (Ca), strontium (Sr), barium (Ba), or combinations thereof; and an activator comprising europium. The phosphor composition is formed from combining carbonate or oxides of metal M, silicon oxide, and europium oxide; and then firing the combination. A lighting apparatus including the phosphor composition is also provided. The phosphor composition may be combined with an additional phosphor to generate white light.

17 Claims, 4 Drawing Sheets

(52) U.S. Cl.
CPC .......... *C09K 11/7735* (2013.01); *H01L 33/50* (2013.01); *H01L 33/505* (2013.01)

(56) References Cited

U.S. PATENT DOCUMENTS

| | | |
|---|---|---|
| 7,311,858 B2 | 12/2007 | Wang et al. |
| 7,713,442 B2 | 5/2010 | Tian et al. |
| 7,883,226 B2 | 2/2011 | Li |
| 7,922,937 B2 | 4/2011 | Li et al. |
| 8,030,839 B2 | 10/2011 | Hosokawa et al. |
| 8,517,551 B2 | 8/2013 | Tsukahara et al. |
| 2007/0125982 A1 | 6/2007 | Tian et al. |
| 2008/0061271 A1* | 3/2008 | Takahara ........... C09K 11/0883 252/301.4 H |
| 2016/0168457 A1* | 6/2016 | Camardello ......... C09K 11/617 349/71 |

OTHER PUBLICATIONS

Zhang et al., "The Synthesis and luminescent properties of calcium strontium bromosilicate activated by europium (2+)", Chinese Journal of Atomic and Molecular Physics, vol. No. 8, Issue No. 4, pp. 2095-2100, Oct. 31, 1991.

International Search Report and Written Opinion issued in connection with corresponding PCT Application No. PCT/US2015/062258 dated Feb. 17, 2016.

Wang et al., "Preparation and luminescence characteristics of Eu-doped calcium chloride silicate Ca7Si2O8Cl6", Journal of Alloys and Compounds, Science Direct, vol. 589, pp. 120-124, Mar. 15, 2014.

\* cited by examiner

PHOSPHOR COMPOSITIONS AND LIGHTING APPARATUS THEREOF

FIELD

The invention relates generally to phosphor compositions applicable to, for example, lighting systems. The invention also relates to a lighting apparatus employing these phosphors and blends thereof.

BACKGROUND

A phosphor is a luminescent material that absorbs radiation energy in a portion of the electromagnetic spectrum and emits radiation energy in another portion of the electromagnetic spectrum. One important class of phosphors includes crystalline inorganic compounds of very high chemical purity and of controlled composition to which small quantities of other elements (called "activators") have been added to convert them into efficient fluorescent materials. The color of the emitted radiation can be controlled in part by the several combinations of activator and inorganic compound. Most useful and well-known phosphors emit radiation (also referred to as light herein) in the visible portion of the electromagnetic spectrum in response to excitation by electromagnetic radiation outside the visible range. The phosphors may be used in a light emitting diode (LED), for example, to generate colored emissions that may generally not be obtained from the LED itself.

Light emitting diodes (LEDs) are semiconductor light emitters often used as a replacement for other light sources, such as incandescent lamps. A combination of LED-generated light and phosphor generated light may be used to produce white light. The most popular white LEDs are based on blue-emitting GaInN chips. The blue-emitting LEDs are coated with a phosphor or a phosphor blend including red-emitting, green-emitting and blue-emitting phosphors that converts some of the blue radiation to a complementary color, for example a yellow-green emission. The combined light from the phosphor and the LED chip provides white light having a color point with corresponding color coordinates (ccx and ccy) and correlated color temperature (CCT), and its spectral distribution provides a color rendering capability, measured by the color rendering index (CRI).

Generation of "white light" is currently achieved by so called "white LEDs" that are constituted by employing a blue LED in conjunction with a yellow-green-emitting, cerium-doped yttrium aluminum garnet known as "YAG," having the formula $Y_3Al_5O_{12}:Ce^{3+}$. YAG has been historically used in these lighting systems because of its high quantum efficiency under blue light excitation and a broad emission spectrum that peaks in the yellow spectral region. One drawback of YAG-based lighting systems is their relatively poor color rendering properties and high color temperature. For example, when an object is illuminated under such currently used white LEDs, the object colors appear somewhat different from the colors produced by natural light.

A phosphor composition used for LED is desired to efficiently absorb blue radiation, emit with high quantum efficiency, and be stable in light output at elevated temperatures. Although numerous phosphors have been proposed in the past several years, the range of phosphors suitable for LEDs is limited. Therefore, there is a need for phosphors that produce improved color rendering in white-light-emitting, solid-state lighting systems.

BRIEF DESCRIPTION

In one embodiment, a phosphor composition is provided, wherein the phosphor composition comprises at least 10 atomic % bromine; silicon, germanium or combination thereof; oxygen; a metal M, wherein M comprises zinc (Zn), magnesium (Mg), calcium (Ca), strontium (Sr), barium (Ba), or combinations thereof; and an activator comprising europium.

In another embodiment, a phosphor composition is provided, wherein the phosphor composition, comprises: a phase having nominal formula $M_5Z_2O_7(Br_{4-n}X_n):A$, a phase having nominal formula $M_3ZO_4(Br_{2-n}X_n):A$, a phase having nominal formula $M_9Z_3O_{12}(Br_{2-n}X_n)_3:A$, or a combination of two or more of these phases; wherein M comprises zinc (Zn), magnesium (Mg), calcium (Ca), strontium (Sr), barium (Ba), or combinations thereof; wherein Z comprises silicon (Si), germanium (Ge) or combinations thereof; wherein X is an additional halogen selected from fluorine (F), chlorine (Cl), iodine (I), or combinations thereof, and wherein A is an activator comprising europium (Eu), and n is a number from 0 to 2.

In yet another embodiment, a lighting apparatus is provided, wherein the lighting apparatus comprises a light source; and a phosphor material radiationally coupled to the light source, wherein the phosphor material comprises at least 10 atomic % bromine; silicon, germanium or combination thereof; oxygen; a metal M, wherein M comprises zinc (Zn), magnesium (Mg), calcium (Ca), strontium (Sr), barium (Ba), or combinations thereof; and an activator comprising europium.

In yet another embodiment, a lighting apparatus is provided, wherein the lighting apparatus comprises a light source; and a phosphor material radiationally coupled to the light source. In this embodiment, the phosphor material comprises a phase having nominal formula $M_5Z_2O_7(Br_{4-n}X_n):A$, a phase having nominal formula $M_3ZO_4(Br_{2-n}X_n):A$, a phase having nominal formula $M_9Z_3O_{12}(Br_{2-n}X_n)_3:A$, or a combinations of two or more of these phases, wherein M comprises zinc (Zn), magnesium (Mg), calcium (Ca), strontium (Sr), barium (Ba), or combinations thereof; wherein Z comprises silicon (Si), germanium (Ge) or combinations thereof; wherein X is an additional halogen selected from fluorine (F), chlorine (Cl), iodine (I), or combinations thereof, and wherein A is an activator comprising europium (Eu), and n is a number from 0 to 2.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
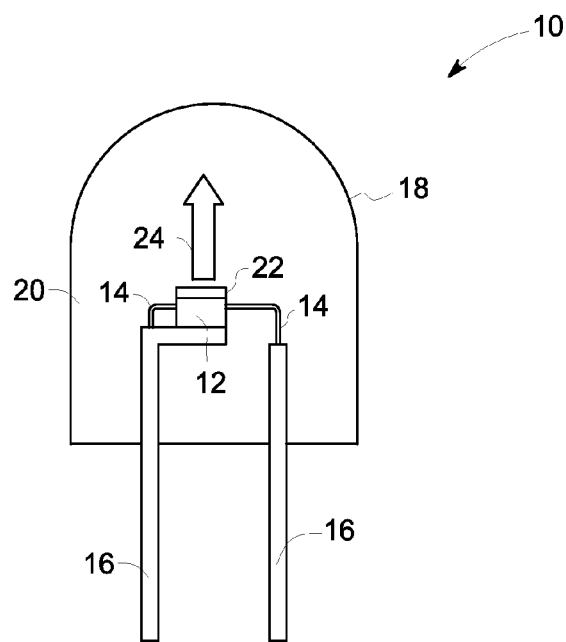
FIG. 1 is a schematic cross sectional view of a lighting apparatus according with one embodiment of the invention.
Figure 2:
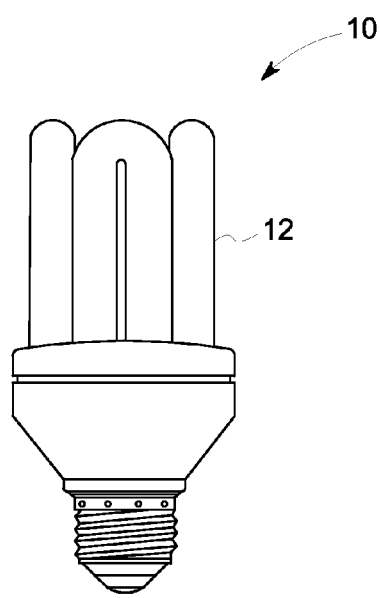
FIG. 2 is a schematic cross sectional view of a lighting apparatus, in accordance with another embodiment of the invention.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

In the following specification and the claims that follow, the singular forms "a", "an" and "the" include plural referents unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances, an event or capacity can be expected, while in other circumstances the event or capacity cannot occur—this distinction is captured by the terms "may" and "may be".

As used herein, the term "phosphor" or "phosphor material" or "phosphor composition" may be used to denote both a single phosphor composition as well as a blend of two or more phosphor compositions. As used herein, the term "lamp" or "lighting apparatus" or "lighting system" refers to any source of visible and/or ultraviolet light that includes at least one light emitting element producing a light emission when energized, for example a phosphor material or a light emitting diode.

The terms "substitution" and "doping" refer to adding an amount of an element in a material. Typically, an element in a material is partially or fully replaced by another element on such addition. It should be noted that phosphors described herein may be written, for example, as $M_5Si_2O_7Br_4$:A. As it is understood by those skilled in the art, this type of notation means that the phosphor includes the composition $M_5Si_2O_7Br_4$ wherein one or more element A has been doped into the composition. The element(s) included in "A" are referred to herein as a "dopant" and/or an "activator".

The term "nominal formula" refers to an empirical formula, which is being used to represent a nominal composition. The nominal formula of a composition may be written as a chemical formula denoting a specific stoichiometry, but it will be appreciated by those skilled in the art that deviations from the explicitly denoted stoichiometry by substitution with one or more atoms are expressed by the nominal formula and its associated nominal composition.

Phosphor compositions and blends that provide different colored light emissions are described herein. In addition, the use of the phosphor compositions and blends in LED and other light sources is also described. The phosphor composition is applicable for producing a color-tunable emission spectrum that is useful for converting the blue radiation of the LED devices to green or orange-red radiation. The color of the generated visible light is dependent on the particular components of the phosphor material. The phosphor material may include only a single phosphor composition, or a blend of two or more phosphors of basic color, for example a particular mixture with one or more of a yellow and red phosphor to emit a desired color (tint) of light. A phosphor composition is described herein, in conjunction with techniques and apparatus for converting LED-generated ultraviolet (UV), violet, or blue radiation into a desired color light for general illumination or other purposes.

One embodiment of the present invention is a phosphor composition, wherein the phosphor composition comprises at least 10 atomic percent (%) bromine; silicon, germanium or combination thereof; oxygen; a metal element M, and an activator. In these embodiments, the M comprises zinc (Zn), magnesium (Mg), calcium (Ca), strontium (Sr), barium (Ba), or combinations thereof. In these embodiments, the phosphor composition comprises europium as an activator.

As noted, the phosphor composition comprises at least 10 atomic % bromine (Br). In some embodiments, the phosphor composition further comprises an additional halogen component. In these embodiments, the additional halogen component comprises chlorine, fluorine, iodine, or combinations thereof. In some embodiments, a ratio of bromine to the additional halogen component is greater than about 1:1. For example, one illustrative embodiment of the phosphor composition comprises 15 atomic percent Br and at least 5 atomic percent Cl, F or I. In some embodiments, the composition comprises at least 18 atomic percent Br and at least 2 atomic percent additional halogens, such as Cl, F and I.

Furthermore, the phosphor composition is doped with an activator ion. As used herein, the term "activator ion" refers to an ion (for example $Eu^{2+}$) that forms a luminescent center when doped in a phosphor. The phosphor composition described herein comprises an activator comprising europium (Eu). In some embodiments, the phosphor composition is activated with a divalent europium ($Eu^{2+}$). In one or more embodiments, the phosphor composition further comprises manganese, tin, chromium, bismuth, lead, antimony, lanthanides elements or combinations thereof as activators. In some embodiments, $Mn^{2+}$ ions may be introduced on the M site to increase the gamut of the emission color via an energy transfer from $Eu^{2+}$ to $Mn^{2+}$. Other activators may be introduced on the M site to yield phosphors that are more suited for 254 nm excitation obtained from a mercury based fluorescent lamp. The composition may comprise the activator ions $Mn^{2+}$, $Mn^{4+}$, $Ce^{3+}$, $Sn^{2+}$, $Bi^{3+}$, $Sb^{3+}$, $Cr^{3+}$, $Pb^{2+}$ or combinations thereof, which may be substituted on the M site.

In some embodiments, the composition comprises a phase having a nominal formula $M_5Z_2O_7(Br_{4-n}X_n)$:A, wherein M comprises Zn, Mg, Ca, Sr, Ba, or combinations thereof; Z comprises silicon (Si), germanium (Ge) or combinations thereof; X is an additional halogen selected from fluorine (F), chlorine (Cl), iodine (I), or combinations thereof, and n is a number from 0 to 2; and A is an activator comprising europium. In one embodiment, the composition comprises a phase having a nominal formula $M_5Z_2O_7Br_4$:A, wherein M comprises Zn, Mg, Ca, Sr, Ba, or combinations thereof; Z comprises silicon (Si), germanium (Ge) or combinations thereof; and the activator A is europium. The composition may further comprise manganese, tin, chromium, bismuth, lead, antimony, lanthanide elements or combinations thereof.

In some embodiments, the composition comprises a phase having a nominal formula $M_5Si_2O_7(Br_{4-n}X_n):A$, wherein M comprises Zn, Mg, Ca, Sr, Ba or combinations thereof; X includes an additional halogen selected from fluorine (F), chlorine (Cl), iodine (I), or combinations thereof, and n is a number from 0 to 2; and A is an activator comprising europium. This composition, in certain embodiments, further comprises one or more additional activator ions $Mn^{2+}$, $Mn^{4+}$, $Ce^{3+}$, $Sn^{2+}$, $Bi^{3+}$, $Sb^{3+}$, $Cr^{3+}$, $Pb^{2+}$ or combinations thereof, which may be substituted on the M site. In some embodiments, the silicon of the host lattice, which resides in the lattice as a quadrivalent ion $Si^{4+}$, is partially replaced by $Ge^{4+}$, or any other cation with $4^+$ value. In one specific embodiment, wherein the n is zero (0), the phosphor composition comprises a phase having a nominal formula $M_5Si_2O_7Br_4:A$, wherein M comprises Zn, Mg, Ca, Sr, Ba, or combinations thereof; and the activator A includes europium. In another embodiment, when n is not zero (0), for example n is one (1), the phosphor composition comprises a phase having a nominal formula $M_5Si_2O_7Br_3X:A$. In this embodiment, the phosphor composition comprises at least one additional halogen, such as F, Cl, or I. In yet another example, when n is two (2), the phosphor composition comprises a phase having a nominal formula $M_5Si_2O_7Br_2X_2:A$ and in this embodiment, the phosphor composition comprises an additional halogen selected from F, Cl or I.

The phosphor composition of general formula $M_5Si_2O_7(Br_{4-n}X_n):A$, such as $M_5Si_2O_7Br_4:Eu^{+2}$, may produce a color-tunable emission spectrum, which may be useful for down-converting the blue radiation of the LED devices to, for example, green or orange-red radiation. M, X, A and n are as described above. The $Eu^{2+}$ emission wavelength in $M_5Si_2O_7(Br_{4-n}X_n)$ may be tuned from green to red emission. For example, the emission color may be tuned from green to red by substituting $Ba^{2+}$ for $Sr^{2+}$, due to the change in crystal fields. In specific compositions, the $Eu^{2+}$ emission is such that it may replace the standard YAG phosphor that is generally applied in blue LED devices.

Advantageously, the phosphor compositions of nominal formula $M_5Si_2O_7(Br_{4-n}X_n):A$ produce an emission spectrum in a relatively narrow wavelength range from about 480 nanometers to about 650 nanometers. The emission spectrum is depressed in the yellow region and shifted towards the blue region as compared to conventional garnet phosphors (for example, yttrium aluminum garnet—$Y_3Al_5O_{12}$: $Ce^{3+}$). The peak emission of the phosphor compositions, in accordance with one embodiment, exists in a wavelength range from about 520 nanometers to about 620 nanometers. In particular embodiments, the peak emission exists in a wavelength range from about 530 nanometers to about 580 nanometers.

In some embodiments, the emission wavelength of the phosphors of formula $M_5Si_2O_7Br_4:A$ may be tuned from 515 nm to 640 nm by adjusting a ratio of the atomic weight of metal M cation and the atomic weight of halogen. For example, for phosphor composition $Sr_5Si_2O_7Br_4: Eu^{2+}$, depending on the amount of $Ca^{2+}$ or $Ba^{2+}$ is substituted for $Sr^{2+}$, the emission color of the phosphor may be tuned, which is due to changing of the crystal fields by the activator ion. The crystal fields may be changed both by cationic and anionic substitutions. In some embodiments, the phosphor composition has a peak emission in a wavelength range from about 515 nanometers to about 640 nanometers. In a specific embodiment, the phosphor composition has a peak emission in a wavelength range from about 530 nanometers to about 570 nanometers.

Figure 3:
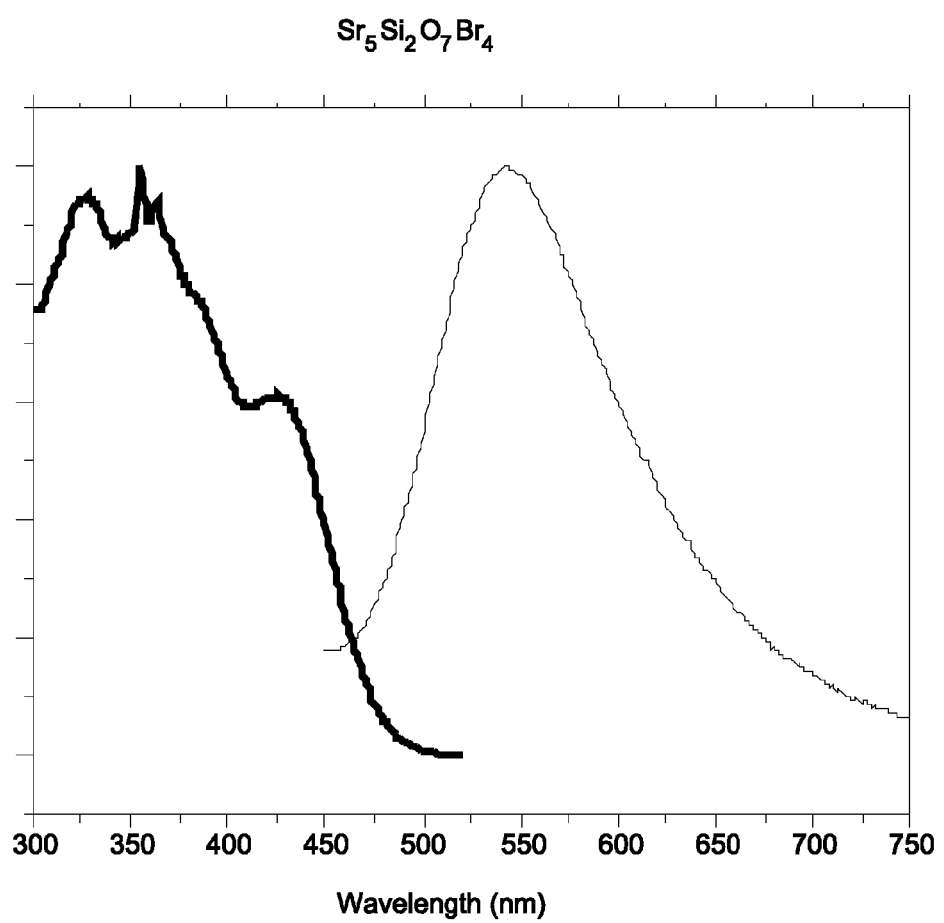
FIG. 3 shows an excitation and emission spectra of a phosphor composition, in accordance with an illustrative embodiment of the invention.

In one embodiment, the phosphor composition $Sr_5Si_2O_7Br_4:Eu^{2+}$ has a peak emission in a wavelength range from about 515 nanometers to about 640 nanometers. The excitation-emission spectrum of a composition $Sr_5Si_2O_7Br_4:Eu^{2+}$ is illustrated in FIG. 3. The emission spectrum of the phosphor composition comprising the nominal formula $Sr_5Si_2O_7Br_4:Eu^{2+}$ shows a peak near 550 nm.

The phosphor compositions comprising formula $M_5Si_2O_7Br_4:A$ as described in above embodiments absorbs radiation in near-UV or blue region (a wavelength range between about 350 nm and about 470 nm) and emits green light. This phosphor composition may be used for different purposes, such as to develop green LEDs that emit near 550 nm. Typically green LEDs are inefficient compared to blue or red LEDs. The phosphor composition of general formula $M_5Si_2O_7Br_4:A$ activated with divalent europium may exhibit more efficient green emission near 550 nm, which may be used to replace conventional green LEDs. Thus, these phosphor compositions may be used in a lighting apparatus to generate light suitable for general illumination and other purposes. In some embodiments, the phosphor compositions may be used in a lighting apparatus to generate green light for applications such as toys, traffic light, backlight, etc. In some embodiments, the phosphor compositions may be used in combination with other phosphors (in a blend) to produce white light.

The conventional garnet phosphors (e.g., YAG) produce yellow-green emission (peak emission~580 nm). When these garnets are used in combination with red-emitting phosphors in a blend to produce white light, the red-green contrast (may also be referred to as red-green separation) is not very good because of the garnets' efficient emission in the yellow region. The phosphor compositions of the present invention, in sharp contrast, have the advantage of producing narrower and blue-shifted emission relative to the conventional garnet phosphors. In some embodiments, the phosphors with emission in the blue-green region (530 nm-540 nm) may be used to produce a blend having better color contrast. For example, the phosphor composition of general formula $M_5Si_2O_7Br_4:A$ activated with divalent europium may be combined with a suitable red-emitting phosphor in LED lighting system.

In an illustrative embodiment, when the present green-emitting phosphor compositions comprising a phase having formula $M_5Si_2O_7Br_4:Eu^{2+}$ are used in combination with a red-emitting phosphor in a blend, the LED-based lighting systems/devices employing such a phosphor blend produce white light with improved color rendering properties as compared to that often achieved by using conventional garnet phosphors. A deficiency in the yellow region of the present phosphor compositions (e.g., $Sr_5Si_2O_7Br_4:Eu^{2+}$) leads to increased red-green color contrast (or enhanced red-green separation) when objects are viewed under these lighting systems in comparison to white LEDs that employ conventional yellow-green garnets. In some embodiments, an improvement in red-green contrast of a blend employing the present phosphor composition is at least about 5 percent, based on the red-green contrast of a blend including conventional garnet. In some specific embodiments, the improvement in red-green contrast is at least about 10 percent. Additionally, the blue-shifted green emission of the present compositions provides additional advantage to color blends when used for green light emitting devices, for example in traffic light and backlights.

In some other embodiments, the composition comprises a phase having a nominal formula $M_3ZO_4(Br_{2-n}X_n):A$, wherein M comprises Zn, Mg, Ca, Sr, Ba, or combinations thereof; Z comprises silicon (Si), germanium (Ge) or combinations thereof; X is an additional halogen selected from fluorine (F), chlorine (Cl), iodine (I), or combinations thereof, and n is a number from 0 to 1; and A is an activator comprising europium. In these embodiments, the composition comprises a phase having a nominal formula $M_3ZO_4Br_2$:A, wherein M comprises Zn, Mg, Ca, Sr, Ba, or combinations thereof; Z comprises silicon (Si), germanium (Ge) or combinations thereof; and the activator A is europium. The composition may further comprise manganese, tin, chromium, bismuth, lead, antimony, lanthanide element or combinations thereof.

In one embodiment, the phosphor composition comprises a phase having a nominal formula $M_3SiO_4(Br_{2-n}X_n)$:A, wherein M comprises Zn, Mg, Ca, Sr, Ba, or combinations thereof; X is an additional halogen selected from fluorine (F), chlorine (Cl), iodine (I), or combinations thereof, and n is a number from 0 to 1; and A is an activator comprising europium. In one embodiment, the phosphor composition comprises a phase having a nominal formula $M_3SiO_4Br_2$:A, wherein M comprises Zn, Mg, Ca, Sr, Ba, or combinations thereof; and the activator A includes europium. In some embodiments, the composition comprising a nominal formula $M_3SiO_4Br_2$:A may further comprise the activator ions $Mn^{2+}$, $Mn^{4+}$, $Ce^{3+}$, $Sn^{2+}$, $Bi^{3+}$, $Sb^{3+}$, $Cr^{3+}$, $Pb^{2+}$ or combinations thereof. Two different phases of phosphor composition $M_3SiO_4Br_2$:A have been observed, such as monoclinic $Sr_3SiO_4Br_2$:$Eu^{2+}$ and triclinic $Sr_9Si_3O_{12}Br_6$:$Eu^{2+}$, as shown in FIGS. 4 and 5, respectively.

In one embodiment, the composition comprises a phase having a nominal formula $Sr_3SiO_4Br_2$:$Eu^{2+}$. In some embodiments, the $Si^{4+}$ of the host lattice may be partially or completely replaced by $Ge^{4+}$ or any other cation with valence of $4^+$. In one embodiment, the $Si^{4+}$ of the host lattice of $Sr_3SiO_4Br_2$:$Eu^{2+}$ is completely replaced by $Ge^{4+}$, wherein the emission from the host lattice changes however the quantum efficacy still remains high as it is for $Si^{4+}$.

In some embodiments, the phosphor composition comprising a phase having a nominal formula $Sr_3SiO_4Br_2$:$Eu^{2+}$ may be further doped with one or more additional activator ion. For example, the lattice of $Sr_3SiO_4Br_2$:$Eu^{2+}$ may further comprise activator ions $Mn^{2+}$, $Mn^{4+}$, $Ce^{3+}$, $Sn^{2+}$, $Bi^{3+}$, $Sb^{3+}$, $Cr^{3+}$, $Pb^{2+}$ or combinations thereof.

Figure 4:
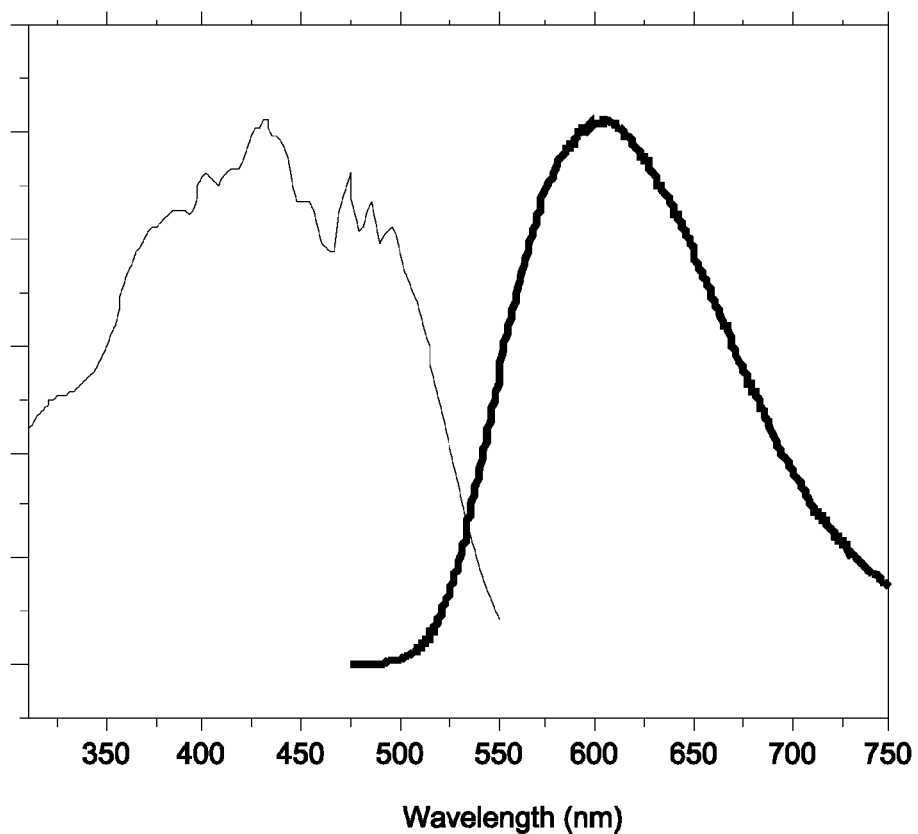
FIG. 4 shows excitation and emission spectra of a phosphor composition, in accordance with another illustrative embodiment of the invention.
Figure 5:
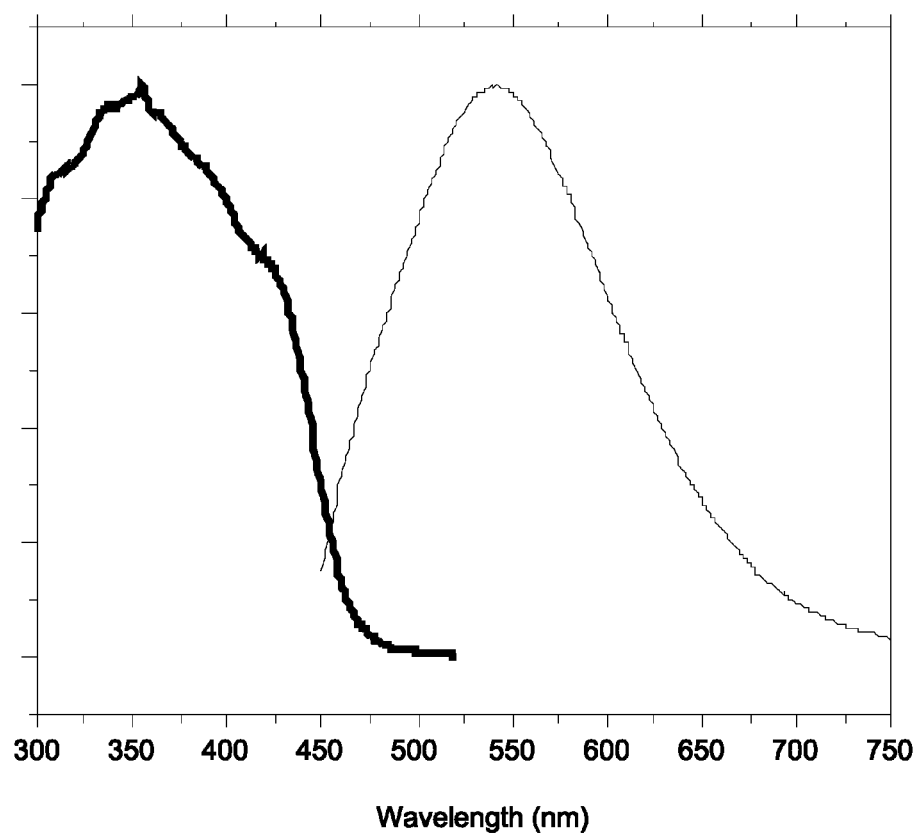
FIG. 5 shows excitation and emission spectra of a phosphor composition, in accordance with another illustrative embodiment of the invention.

The phosphor of formula $Sr_3SiO_4Br_2$:$Eu^{2+}$ is a red-emitting phosphor, which gives a broad emission band centered at 615 nm upon UV excitation, as shown in FIG. 4. The red-emitting phosphor of nominal formula $Sr_3SiO_4Br_2$:$Eu^{2+}$ is chemically stable and provides low color temperature. The red-emitting phosphor $Sr_3SiO_4Br_2$:$Eu^{2+}$ may be deployed alone, or mixed with one or more other phosphors, for example, yellow-emitting phosphor for generating a white lighting package.

The red, green, and yellow emitting inorganic phosphors are typically utilized in conjunction with a highly efficient GaN-based near-UV or blue-emitting LED to achieve a complete color gamut that properly renders colored objects and provides a desirable color temperature. In some embodiments, a red-emitting phosphor, such as $Sr_3SiO_4Br_2$:$Eu^{2+}$, is combined with yellow- and/or green-emitting phosphors to produce a "warmer" white light. For white-light LEDs, the total of the light from the phosphor material and the LED chip provides a color point with corresponding color coordinates (x and y) and correlated color temperature (CCT), and its spectral distribution provides a color rendering capability, measured by the color rendering index (CRI). The red-emitting phosphor $Sr_3SiO_4Br_2$:$Eu^{2+}$ and its blend in conjunction with UV and visible LED chips display high quantum efficiency which may produce white-light LEDs having a high CRI at any given CCT. Thus, one can customize phosphor blends to produce almost any CCT or color point, with corresponding acceptable CRI. In some examples, additional phosphor inclusion may improve in color rendering capability, though the addition of other phosphors may reduce the system efficiency to some degree.

In some other embodiments, the composition comprises a phase having a nominal formula $M_9Z_3O_{12}(Br_{2-n}X_n)_3$:A, wherein M comprises Zn, Mg, Ca, Sr, Ba, or combinations thereof; Z comprises silicon (Si), germanium (Ge) or combinations thereof; X is an additional halogen selected from fluorine (F), chlorine (Cl), iodine (I), or combinations thereof, and n is a number from 0 to 1; and A is an activator comprising europium. In one embodiment, the composition comprises a phase having a nominal formula $M_9Z_3O_{12}Br_6$:A, wherein M comprises Zn, Mg, Ca, Sr, Ba, or combinations thereof; Z comprises silicon (Si), germanium (Ge) or combinations thereof; and the activator A is europium. In these embodiments, the composition further comprises manganese, tin, chromium, bismuth, lead, antimony, lanthanide element or combinations thereof.

In one embodiment, the composition comprises a phosphor of formula $Sr_9Si_3O_{12}Br_6$:$Eu^{2+}$. The phosphor of formula $Sr_9Si_3O_{12}Br_6$:$Eu^{2+}$ is a triclinic crystal phase, and is a green-emitting phosphor that gives a broad emission band centered at 550 nm upon UV excitation, as shown in FIG. 5. The green-emitting phosphor of nominal formula $Sr_9Si_3O_{12}Br_6$:$Eu^{2+}$ is chemically stable and may be used alone or in combination with one or more other phosphors, for example, yellow- and/or red-emitting phosphor for generating a white light. The green-emitting inorganic phosphor $Sr_9Si_3O_{12}Br_6$:$Eu^{2+}$ may be typically utilized in conjunction with a highly efficient GaN-based near-UV or blue-emitting LED and forms a color gamut. In some embodiments, the green-emitting phosphor having a triclinic phase $Sr_9Si_3O_{12}Br_6$:$Eu^{2+}$ is combined with yellow- and/or green-emitting phosphors producing a white light.

In one or more embodiments, a phosphor composition is provided, wherein the composition comprises a phase having nominal formula $M_5Z_2O_7(Br_{4-n}X_n)$:A, a phase having nominal formula $M_3ZO_4(Br_{2-n}X_n)$:A, a phase having nominal formula $M_9Z_3O_{12}(Br_{2-n}X_n)_3$:A, or a combination of two or more of these phases. In one embodiment, a phosphor composition may comprise a phase having nominal formula $M_5Z_2O_7(Br_{4-n}X_n)$:A and a phase having nominal formula $M_3ZO_4(Br_{2-n}X_n)$:A. In another embodiment, a phosphor composition may comprise a phase having nominal formula $M_5Z_2O_7(Br_{4-n}X_n)$:A and a phase having nominal formula $M_9Z_3O_{12}(Br_{2-n}X_n)_3$:A. In yet another embodiment, A phosphor composition may be present which comprises a phase having nominal formula $M_3ZO_4(Br_{2-n}X_n)$:A and a phase having nominal formula $M_9Z_3O_{12}(Br_{2-n}X_n)_3$:A. In these embodiments, M comprises zinc (Zn), magnesium (Mg), calcium (Ca), strontium (Sr), barium (Ba), or combinations thereof; wherein Z comprises silicon (Si), germanium (Ge) or combinations thereof; wherein X is an additional halogen selected from fluorine (F), chlorine (Cl), iodine (I), or combinations thereof, and wherein A is an activator comprising europium (Eu), and n is a number from 0 to 2.

Methods of making a phosphor composition are provided, wherein the composition comprises at least 10 atomic % bromine; silicon, germanium or combination thereof; oxygen; a metal M and an activator comprising europium. One method comprises mixing oxides, carbonates or bromides of M, silicon oxide, ammonium bromide, and europium oxide to form a mixture; and firing the mixture at a temperature between 700-800° C. under a reducing atmosphere, wherein M comprises zinc (Zn), magnesium (Mg), calcium (Ca), strontium (Sr), barium (Ba), or combinations thereof. In one or more embodiments, the phosphor made by the above method is a composition of formula $M_5Si_2O_7(Br_{4-n}X_n):A$, wherein M comprises Zn, Mg, Ca, Sr, Ba, Ge, or combinations thereof; X is an additional halogen selected from fluorine (F), chlorine (Cl), iodine (I), or combinations thereof, and n is a number from 0 to 2; and A is an activator comprising europium. In still other embodiments, the phosphor made by the method includes composition of formula $M_5Si_2O_7Br_4:A$ or $M_3SiO_4Br_2:A$ or $M_9Si_3O_{12}Br_6:A$.

In a first step, powders of the constituent compounds, such as oxides, carbonates or bromides of M, silicon oxide, ammonium bromide and europium oxide are mixed in appropriate amounts. In one embodiment, an amount of metal oxide ranges from about 28 parts by weight to about 70 parts by weight. In one embodiment, an amount of silicon oxide ranges from about 8 parts by weight to about 45 parts by weight. In one embodiment, an amount of bromine ranges from about 20 parts by weight to about 50 parts by weight. In one embodiment, an amount of europium oxide ranges from about 0.5 parts by weight to about 4 parts by weight. Proportions of the raw materials with respect to the other listed raw materials are as set forth above. Mixing may include grinding by any technique known in the art.

In next step, the mixture formed in the first step is fired at a high temperature under a reducing atmosphere. The firing may include heating at a high temperature for a few minutes or to a few hours. In one embodiment, the firing is carried out in a reducing environment, at a temperature less than about 800 degrees Celsius. In some embodiments, the firing temperature may range from about 700 degrees Celsius to about 800 degrees Celsius. In one embodiment, the material is melted and crystallized to form efficient phosphor.

The reducing environment is typically, but not necessarily, a nitrogen-containing atmosphere. A mixture of hydrogen and nitrogen can be used, containing from 90% by volume nitrogen up to substantially pure nitrogen. Usually, however, the reducing environment contain from about 90% to about 99% by volume nitrogen. The firing environment may also include other inert gases such as argon. Although combinations of multiple gases may be utilized, consideration should be given to process design, and if the use of multiple carrier gases provides no or negligible advantage, preference in some cases may be given to the utilization of only hydrogen and nitrogen.

In some embodiments, the firing step may include one or more sub-steps, where one or more of the sub-steps may be carried out by, for example, using a different temperature or pressure and/or a different environment. The sub-steps may also include grinding the mixture in one or more of the sub-steps before firing.

Some embodiments of the invention are directed to a lighting apparatus that comprises a phosphor material. The phosphor material includes the phosphor composition as disclosed in above embodiments. In some embodiments, a lighting apparatus is provided, wherein the lighting apparatus comprises a light source and a phosphor material radiationally coupled to the light source. In these embodiments, the phosphor material comprises at least 10 atomic % bromine; silicon, germanium or combination thereof; oxygen; a metal M comprising zinc (Zn), magnesium (Mg), calcium (Ca), strontium (Sr), barium (Ba), or combinations thereof, and an activator comprising europium.

In some embodiments, the phosphor material of the lighting apparatus comprises a phase having a nominal formula $M_5Z_2O_7(Br_{4-n}X_n):A$. In some other embodiments, the phosphor material of the lighting apparatus comprises a phase having a nominal formula $M_3ZO_4(Br_{2-n}X_n):A$. In yet other embodiments, the phosphor material of the lighting apparatus comprises a phase having a nominal formula $M_9Z_3O_{12}(Br_{2-n}X_n)_3:A$. In these embodiments, M comprises Zn, Mg, Ca, Sr, Ba, or combinations thereof; Z comprises silicon (Si), germanium (Ge) or combinations thereof; X is an additional halogen selected from fluorine (F), chlorine (Cl), iodine (I), or combinations thereof, and n is a number from 0 to 2; and A is an activator comprises europium, manganese, tin, chromium, bismuth, lead, antimony and lanthanides elements or combinations thereof.

In some embodiments, the lighting apparatus comprises a phosphor material radiationally coupled to the light source, wherein the phosphor material comprises a phase having nominal formula $M_5Z_2O_7(Br_{4-n}X_n):A$, a phase having nominal formula $M_3ZO_4(Br_{2-n}X_n):A$, a phase having nominal formula $M_9Z_3O_{12}(Br_{2-n}X_n)_3:A$, or a combination of two or more of these phases. M comprises zinc (Zn), magnesium (Mg), calcium (Ca), strontium (Sr), barium (Ba), or combinations thereof; wherein Z comprises silicon (Si), germanium (Ge) or combinations thereof; wherein X is an additional halogen selected from fluorine (F), chlorine (Cl), iodine (I), or combinations thereof, and wherein A is an activator comprising europium (Eu), and n is a number from 0 to 2.

In some embodiments, the phosphor material of the lighting apparatus further comprises a second phosphor composition. As noted, the phosphor compositions described herein have the advantage of producing a color-tunable emission spectrum that is useful for down-converting the blue radiation of the LED devices to green or orange-red radiation, wherein the phosphor composition further in combination with a second phosphor composition may form an efficient blend, such as a white-light blend. For example, when green-emitting phosphor compositions as described herein are used in combination with a red-emitting phosphor in a blend, the LED-based lighting systems produce white light with improved color rendering properties as compared to that often achieved by using conventional garnet. In some embodiments, non-limiting examples of suitable second phosphor include a garnet, a nitride, and an oxynitride.

When the phosphor material includes a blend of two or more phosphors, the ratio of each of the individual phosphors in the phosphor blend may vary, depending on the characteristics of the desired light output, for example color temperature. The relative amounts of each phosphor in the phosphor blend can be described in terms of spectral weight. The spectral weight is the relative amount that each phosphor contributes to the overall emission spectrum of the device. The spectral weight amounts of all the individual phosphors and any residual bleed from the LED source should add up to 100%. In a preferred embodiment, each of the above described phosphors in the blend will have a spectral weight ranging from about 1 percent to about 95 percent.

The relative proportions of each phosphor in the phosphor blends may be adjusted, so that when their emissions are blended and employed in a lighting device, there is produced visible light of predetermined ccx and ccy values on the CIE (International Commission on Illumination) chromaticity diagram. As stated, blends that produce a white light are particularly desirable. This white light may, for instance, possess a ccx value in the range from about 0.25 to about 0.55, and a ccy value in the range from about 0.25 to about 0.55. The phosphors used to make phosphor blend, may be produced by mixing powders of the constituent compounds.

In one embodiment, the light source may be a semiconductor radiation source, for example a light emitting diode (LED), 12 as shown in FIG. 1, or an organic light emitting device (OLED). The term "radiationally coupled" means that the source and the phosphor are situated such that the phosphor can readily receive radiation from the source. In some embodiments, the radiation from the light source is transmitted to the phosphor material, and the phosphor emits radiation of different wavelengths. A combination of the light from the light source and the light emitted from the phosphor material may be used to produce a desired color emission or white light. For example, a white light-emitting LED device may be based on a blue emitting InGaN LED chip. The blue-emitting LED chip may be coated with a phosphor composition or a phosphor blend to convert some of the blue radiation to a complementary color, e.g. a green emission or a white emission.

Non-limiting examples of lighting apparatus include devices for excitation by light-emitting diodes (LEDs) such as fluorescent lamps, cathode ray tubes, plasma display devices, liquid crystal displays (LCD's), UV excitation devices, such as in chromatic lamps, lamps for backlighting, liquid crystal systems, plasma screens, xenon excitation lamps, and UV excitation marking systems. These uses are meant to be merely exemplary and not exhaustive.

FIG. 1 illustrates a lighting apparatus 10 according to some embodiments of the present invention. The lighting apparatus is referred to herein as a lamp, wherein the lamp 10 includes a light-emitting diode (LED) chip 12, and leads 14 electrically attached to the LED chip. The leads 14 provide current to LED chip 12 and thus cause it to emit radiation. The LED chip 12 may be any semiconductor blue or ultraviolet light source, for example based on a nitride compound semiconductor of formula $In_iGa_jAl_kN$ (where $0 \leq i$; $0 \leq j$; $0 \leq k$ and $i+j+k=1$) having an emission wavelength greater than about 250 nm and less than about 550 nm. More particularly, the chip 12 may be a near-UV or blue-emitting LED having a peak emission wavelength from about 300 nm to about 500 nm. Such LEDs are known in the art. In lighting apparatus 10, a phosphor material (as described below) is disposed on a surface of the LED chip 12, and is radiationally coupled to the chip 12. The phosphor material can be deposited on the LED 12 by any appropriate method known in the art. The light emitted by the LED chip 12 mixes with the light emitted by the phosphor material to produce desired emission (indicated by arrow 24).

Although the general discussion of the exemplary structures of the invention discussed herein are directed toward inorganic LED based light sources, it should be understood that the LED chip may be replaced by an organic light emissive structure or other radiation source, unless otherwise noted, and that any reference to an LED chip or semiconductor is merely representative of any appropriate radiation source.

With reference to FIG. 1, the LED chip 12 may be encapsulated within an envelope 18, which encloses the LED chip and an encapsulant material 20. The LED chip 12 may be enclosed by the encapsulant material 20. The encapsulant material 20 may be a low temperature glass, or a thermoplastic or thermoset polymer, or resin as known in the art, for example, a silicone or epoxy resin. In an alternate embodiment, the lamp 10 may only comprise an encapsulant without an outer envelope 18.

Various structures of the lamp 10 are known in the art. For example, in some embodiments, the phosphor material may be interspersed within the encapsulant material, instead of being disposed directly on the LED chip 12. In some other embodiments, the phosphor material may be coated onto a surface of the envelope, instead of being formed over the LED chip. Moreover, in some embodiments, the lamp may include a plurality of LED chips. The shell 18 and the encapsulant 20 are transparent, that is substantially optically transmissive, with respect to the wavelength of light produced by the LED chip 12 and a phosphor material 22. However, if the LED chip 12 emits light that is within the UV spectrum, the encapsulant 20 may only be transparent to light from the phosphor material 22. In some other embodiments, the LED based lighting apparatus 10 may include an encapsulant 20 without an outer shell 18. In this application, the LED chip 12 may be supported by the package leads 16, or by a pedestal (not shown) mounted to the package leads 16. These various structures discussed with respect to FIG. 1 may be combined, with the phosphor material located in any two or all three locations or in any other suitable location, such as separately from the envelop or integrated into the LED. Further, different phosphor blends may be used in different parts of the structure.

In some embodiments, the lighting apparatus can be a fluorescent lamp or a compact fluorescent lamp (CFL), in combination with a LED. For instance, a combination of a LED-generated light and a phosphor-generated light may be used to produce visible light having enhanced color contrast. In this instance, a LED can be mounted in the base of the fluorescent lamp, for example CFL lamp to add to or supplement light in select wavelength regions of the visible spectrum, such as a portion of blue region, to the light being generated by the phosphor composition coated on the glass envelope of a lamp 10.

In any of the above structures, the LED-based lighting apparatus 10 may also include a plurality of particles (not shown) to scatter or diffuse the emitted light. These scattering particles would generally be embedded in the encapsulant 20. The scattering particles may include, for example, particles made from $Al_2O_3$ (alumina) or $TiO_2$ (titania). The scattering particles may effectively scatter the light emitted from the LED chip 12, preferably with a negligible amount of absorption.

As mentioned previously, the phosphor material may further include an additional phosphor composition to form a phosphor blend to produce white light from the lighting apparatus. In some embodiments, the phosphor blend may be applicable in a white light emitting LED lighting systems. In one embodiment, the phosphor blend includes the phosphor composition (for example, phosphor of general formula $M_5Si_2O_7Br_4:A$) as described above, and an additional phosphor composition that has a peak emission in an wavelength range from about 590 nanometers to about 680 nanometers.

The additional phosphor may be a complex halide that is a line emitter and generates red light. Suitable examples include complex halides doped with $Mn^{4+}$, for example $(Na, K, Rb, Cs, NH_4)_2[(Ti, Ge, Sn, Si, Zr, Hf)X_6]:Mn^{4+}$ and the like. In certain instances, the phosphor blend may comprise a red led. Other non-limiting examples are red-emitting nitride/oxynitride materials activated with divalent europium ($Eu^{2+}$).

The phosphors listed above are not intended to be limiting. Any other phosphors, commercial and non-commercial, that form non-reactive blends with the phosphor compositions of the present invention may be used in blends, and are considered within the scope of the present techniques. Furthermore, some additional phosphors may be used, e.g., those emitting throughout the visible spectrum region, at wavelengths substantially different from those of the phosphors described herein. These additional phosphors may be used in the blend to customize the white color of the resulting light, and to produce sources with improved light quality.

When the phosphor material includes a blend of two or more phosphors, the ratio of each of the individual phosphors in the phosphor blend may vary, depending on the characteristics of the desired light output, for example color temperature. The relative amounts of each phosphor in the phosphor blend can be described in terms of spectral weight. The spectral weight is the relative amount that each phosphor contributes to the overall emission spectrum of the device. The spectral weight amounts of all the individual phosphors and any residual bleed from the LED source should add up to 100%.

The phosphors used to make phosphor blends, may be produced by mixing powders of the constituent compounds or by any technique known in the art. As known to those skilled in the art, the relative proportions of each phosphor in the phosphor blends may be adjusted, so that when their emissions are blended and employed in a lighting device or apparatus, there is produced visible light of predetermined ccx and ccy values on the CIE (International Commission on Illumination) chromaticity diagram.

By assigning appropriate spectral weights for each phosphor, one can create spectral blends to cover the relevant portions of color space for white lamps. For various desired CCT's and CRI's, one can determine the appropriate amounts of each phosphor to include in the blend. As noted, desired CCTs and CRIs may be achieved for a blend as the total of the light from the phosphor material and the LED chip provides a color point with corresponding color coordinates (x and y) and CCT, and its spectral distribution may be measured by the CRI. Thus, one can customize phosphor blends to produce almost any CCT or color point, with corresponding acceptable CRI.

The CRI is commonly defined as a mean value for 8 standard color samples ($R_{1-8}$), usually referred to as the General Color Rendering Index and abbreviated as $R_a$, although 14 standard color samples are specified internationally and one can calculate a broader CRI ($R_{1-14}$) as their mean value. In particular, the $R_9$ value, measuring the color rendering for the strong red, is very important for a range of applications, especially of medical nature.

Each of the general formulas listed herein is independent of every other general formula listed. Specifically, A, X, n and other variables that may be used as numeric placeholders in a formula are not related to any usage of A, X, n and other variables that may be found in other formulas or compositions.

EXAMPLES

The examples that follow are merely illustrative, and should not be construed to be any sort of limitation on the scope of the claimed invention.

The following series of examples present the synthesis of reference phosphors in accordance with some embodiments of the present invention. A comparative analysis of the characterization studies of the phosphors prepared using these synthesis methods is also presented.

Example 1

Synthesis of Phosphor Material

Materials: High purity strontium carbonate ($SrCO_3$), silicon oxide ($SiO_2$) and europium oxide ($Eu_2O_3$) (99.9%) and high purity ammonium bromide ($NH_4Br$) (98+%) were used without further purification. All the raw materials were sieved through 325 mesh.

The starting materials, the weight of the reactants (in grams) and the firing temperature to make a 5 gram batch of phosphor are listed below in Table 1. In each case, 1% $Eu^{2+}$ was doped on the $Sr^{2+}$ site under the condition of 0.5% $H_2$-99.5% $N_2$ atmosphere. The weight of $SiO_2$ was adjusted for the amount of water absorbed to the powder. To form compounds of $Sr_3SiO_4Br_2$ and $Sr_9Si_3O_{12}Br_6$, the same amount of starting materials were used, the final firing temperature was different based on its transition from monoclinic to triclinic crystal form. For $Sr_9Si_3O_{12}Br_6$, 50% excess weight of $NH_4Br$ was added before the $2^{nd}$ firing.

TABLE 1

Reactants and conditions for synthesis of phosphor materials

| Phase | $SrCO_3$ | $Eu_2O_3$ | $SiO_2$ | $NH_4Br$ | $1^{st}$ fire | $2^{nd}$ fire |
|---|---|---|---|---|---|---|
| $Sr_3SiO_4Br_2$ | 4.2431 | 0.0511 | 0.6129 | 1.8958 | 700° C. | 750° C. |
| $Sr_9Si_3O_{12}Br_6$ | 4.2431 | 0.0511 | 0.6129 | 1.8958 | 600° C. | 650° C. |
| $Sr_5Si_2O_7Br_4$ | 3.9327 | 0.0473 | 0.6817 | 2.1085 | 800° C. | 950° C. |

The starting materials ($SrCO_3$, $SiO_2$, and $Eu_2O_3$) for synthesizing the phosphor compositions were weighed into a plastic bottle, then blended with YSG media in presence of excess $NH_4Br$ and ball milled for 1 hour. Then, the blended powder was placed in an alumina crucible and fired at the "$1^{st}$ fire" temperature as noted in Table 1 for 1 hour under 0.5% $H_2$-99.5% $N_2$ atmosphere. After firing, the powder was filtered through a 60 mesh sieve and re-blended for 1 hr, and then the powder was re-fired at the "$2^{nd}$ fire" temperature (Table 1) under 0.5% $H_2$-99.5% $N_2$ atmosphere. The product phosphors were collected and characterized by X-ray diffraction.

For synthesizing $Sr_3SiO_4Br_2$, $Sr_9Si_3O_{12}Br_6$ and $Sr_5Si_2O_7Br_4$ phases, the starting materials ($SrCO_3$ or $SrBr_2$), hold times (5 hrs to 10 hrs), atmosphere (0.5% $H_2$ or 1% $H_2$) or temperature may be varied to synthesize the same phosphor end products.

Example 2

Characterization of Phosphor Materials

The product phosphors were sieved through 325 mesh and were then characterized by X-ray diffraction. Powder X-ray diffraction patterns were obtained using PANalytical diffractometer with Cu—$K_\alpha$ radiation in Bragg-Brentano geometry. The X-ray diffraction study was performed using the $K_\alpha$ line with copper (Cu) as an anticathode according to the Bragg-Brentano method. The initial samples showed bright emission and the X-ray diffraction (XRD) study determined three different phases. The determined phases were not known in the art and a Rietveld analysis was not performed as the structural similarity of the synthesized compounds with other compounds present in the database were not found.

The three new phases detected by XRD remained unidentified after extensive efforts to index the spectra. Purified powder materials for each phase were then melted and solidified to form respective single crystals to resolve the structures. After obtaining a phase of pure powder, the powder was melted in an excess of $SrBr_2$, which was used as flux. The melted powder was then cooled slowly in the furnace at 5° C./hr rate. The excess flux material was washed with alcohol and the crystals were collected. With the slow cooling, single crystals were obtained which were large enough to perform single crystal XRD and the respective phases were determined to be $Sr_3SiO_4Br_2$, $Sr_9Si_3O_{12}Br_6$ and $Sr_5Si_2O_7Br_4$.

The excitation-emission spectra of a composition comprising a phase having nominal formula $Sr_5Si_2O_7Br_4:Eu^{2+}$ are illustrated in FIG. 3, wherein the phosphor composition ($Sr_5Si_2O_7Br_4:Eu^{2+}$) emitted near 550 nm (as shown in FIG. 3). The narrower emission bands observed for this composition suggest that the composition may provide higher efficacy and desired color relative to standard LED phosphors that are available commercially.

Another compound identified in the experiment described above was a monoclinic crystal phase having nominal formula $Sr_3SiO_4Br_2:Eu^{2+}$, wherein the crystal had three unequal crystal axes with one oblique intersection in the crystal structure. An emission spectrum near 600 nm was obtained for the phosphor composition of a nominal formula $Sr_3SiO_4Br_2:Eu^{2+}$, as shown in FIG. 4. The $Sr_3SiO_4Br_2:Eu^{2+}$ compounds showed characteristic red emission. FIG. 4 illustrates that this phosphor phase showed a broad spectrum with a peak at 590 nm upon 450 nm excitation.

Another composition identified in the experiment described above included a triclinic crystal structure having nominal formula $Sr_9Si_3O_{12}Br_6:Eu^{2+}$, wherein the crystal had three unequal crystal axes intersecting at oblique angles. An emission spectrum near 550 nm was obtained for the phosphor composition having nominal formula $Sr_9Si_3O_{12}Br_6:Eu^{2+}$, as shown in FIG. 5. FIG. 5 illustrates that this phosphor phase emitted a broad spectrum with a peak at 545 nm upon 350 nm excitation.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A phosphor composition comprising a phase having a nominal formula $M_5Z_2O_7(Br_{4-n}X_n):A$, wherein M is selected from the group consisting of Zn, Mg, Ca, Sr, Ba, and combinations thereof; Z comprises germanium (Ge) or a combination of germanium (Ge) and silicon (Si); X is an additional halogen selected from the group consisting of fluorine (F), chlorine (Cl), iodine (I) and combinations thereof, and n is a number from 0 to 2; and A is an activator comprising europium.

2. The phosphor composition of claim 1, wherein the composition comprises a phase having a nominal formula $M_5Z_2O_7Br_4:A$, wherein M is selected from the group consisting of Zn, Mg, Ca, Sr, Ba, and combinations thereof; Z comprises germanium (Ge) or a combination of germanium (Ge) and silicon (Si); and the activator A is europium.

3. The phosphor composition of claim 1, wherein the composition further comprises manganese, tin, chromium, bismuth, lead, antimony, lanthanide elements or combinations thereof.

4. The phosphor composition of claim 1, wherein the composition comprises a phase having a nominal formula $M_5Ge_2O_7Br_4:A$, wherein M is selected from the group consisting of Zn, Mg, Ca, Sr, Ba, and combinations thereof; and the activator A is europium.

5. A phosphor composition comprising a phase having a nominal formula $M_3ZO_4(Br_{2-n}X_n):A$, wherein M is selected from the group consisting of Zn, Mg, Ca, Sr, Ba, and combinations thereof; Z comprises germanium (Ge) or a combination of germanium (Ge) and silicon (Si); X is an additional halogen selected from the group consisting of fluorine (F), chlorine (Cl), iodine (I), and combinations thereof, and n is a number from 0 to 1; and A is an activator comprising europium.

6. The phosphor composition of claim 5, wherein the composition comprises a phase having a nominal formula $M_3ZO_4Br_2:A$, wherein M is selected from the group consisting of Zn, Mg, Ca, Sr, Ba, and combinations thereof; Z comprises germanium (Ge) or a combination of germanium (Ge) and silicon (Si); and the activator A is europium.

7. The phosphor composition of claim 5, wherein the composition further comprises manganese, tin, chromium, bismuth, lead, antimony, lanthanide element or combinations thereof.

8. The phosphor composition of claim 5, wherein the composition comprises a phase having a nominal formula $M_3GeO_4Br_2:A$, wherein M is selected from the group consisting of Zn, Mg, Ca, Sr, Ba, and combinations thereof; and the activator A is europium.

9. A phosphor composition comprising a phase having a nominal formula $M_9Z_3O_{12}(Br_{2-n}Xn)_3:A$, wherein M is selected from the group consisting of Zn, Mg, Ca, Sr, Ba, and combinations thereof; Z is selected from the group consisting of silicon (Si), germanium (Ge) and combinations thereof; X is an additional halogen selected from the group consisting of fluorine (F), chlorine (Cl), iodine (I), and combinations thereof, and n is a number from 0 to 1; and A is an activator comprising europium.

10. The phosphor composition of claim 9, wherein the composition comprises a phase having a nominal formula $M_9Z_3O_{12}Br_6:A$, wherein M is selected from the group consisting of Zn, Mg, Ca, Sr, Ba, and combinations thereof; Z is selected from the group consisting of silicon (Si), germanium (Ge) and combinations thereof; and the activator A is europium.

11. The phosphor composition of claim 9, wherein the composition further comprises manganese, tin, chromium, bismuth, lead, antimony, lanthanide element or combinations thereof.

12. The phosphor composition of claim 9, wherein the composition comprises a phase having a nominal formula $M_9Si_3O_{12}Br_6:A$, wherein M is selected from the group consisting of Zn, Mg, Ca, Sr, Ba, and combinations thereof; and the activator A is europium.

13. A phosphor composition, comprising: a phase having nominal formula $M_5Z_2O_7(Br_{4-n}X_n):A$, a phase having nominal formula $M_3ZO_4(Br_{2-n}X_n):A$, a phase having nominal formula $M_9Z_3O_{12}(Br_{2-n}X_n)_3:A$, or a combination of two or more of these phases;

wherein M is selected from the group consisting of zinc (Zn), magnesium (Mg), calcium (Ca), strontium (Sr), barium (Ba), and combinations thereof;

wherein Z comprises germanium (Ge) or a combination of germanium (Ge) and silicon (Si);

wherein X is an additional halogen selected from the group consisting of fluorine (F), chlorine (Cl), iodine (I), and combinations thereof, and wherein A is an activator comprising europium (Eu), and n is a number from 0 to 2.

14. A lighting apparatus comprising:

a light source; and a phosphor material radiationally coupled to the light source, wherein the phosphor material comprises a phase having a nominal formula $M_5Z_2O_7(Br_{4-n}X_n):A$, wherein M is selected from the group consisting of Zn, Mg, Ca, Sr, Ba, and combinations thereof; Z comprises germanium (Ge) or a combination of germanium (Ge) and silicon (Si); X is an additional halogen selected from the group consisting of fluorine (F), chlorine (Cl), iodine (I), and combinations thereof, and n is a number from 0 to 2; and A is an activator is selected from the group consisting of europium, manganese, tin, chromium, bismuth, lead, antimony and lanthanides elements and combinations thereof.

15. A lighting apparatus comprising:
a light source; and
a phosphor material radiationally coupled to the light source, wherein the phosphor material comprises a phase having a nominal formula $M_3ZO_4(Br_{2-n}X_n):A$, wherein M is selected from the group consisting of Zn, Mg, Ca, Sr, Ba, and combinations thereof; Z comprises germanium (Ge) or a combination of germanium (Ge) and silicon (Si); X is an additional halogen selected from the group consisting of fluorine (F), chlorine (Cl), iodine (I), and combinations thereof, and n is a number from 0 to 1; and A is an activator is selected from the group consisting of europium, manganese, tin, chromium, bismuth, lead, antimony, lanthanides elements and combinations thereof.

16. A lighting apparatus comprising:
a light source; and
a phosphor material radiationally coupled to the light source, wherein the phosphor material comprises a phase having a nominal formula $M_9Z_3O_{12}(Br_{2-n}X_n)_3$:A, wherein M is selected from the group consisting of Zn, Mg, Ca, Sr, Ba, and combinations thereof; Z comprises germanium (Ge) or a combination of germanium (Ge) and silicon (Si), X is an additional halogen selected from the group consisting of fluorine (F), chlorine (Cl), iodine (I), and combinations thereof, and n is a number from 0 to 1; and A is an activator comprising europium.

17. A lighting apparatus comprising:
a light source; and
a phosphor material radiationally coupled to the light source, wherein the phosphor material comprises a phase having nominal formula $M_5Z_2O_7(Br_{4-n}X_n):A$, a phase having nominal formula $M_3ZO_4(Br_{2-n}X_n):A$, a phase having nominal formula $M_9Z_3O_{12}(Br_{2-n}X_n)_3:A$, or combinations of two or more of these phases,
wherein M is selected from the group consisting of zinc (Zn), magnesium (Mg), calcium (Ca), strontium (Sr), barium (Ba), and combinations thereof;
wherein Z comprises germanium (Ge) or a combination of germanium (Ge) and silicon (Si);
wherein X is an additional halogen selected from the group consisting of fluorine (F), chlorine (Cl), iodine (I), and combinations thereof, and
wherein A is an activator comprising europium (Eu), and n is a number from 0 to 2.

* * * * *